US011911857B2

(12) United States Patent
Zhang et al.

(10) Patent No.: US 11,911,857 B2
(45) Date of Patent: Feb. 27, 2024

(54) APPARATUS AND SYSTEMS TO DETERMINE VOLTAGE MEASUREMENTS IN WELDING-TYPE APPLICATIONS

(71) Applicant: ILLINOIS TOOL WORKS INC., Glenview, IL (US)

(72) Inventors: Bo Zhang, Appleton, WI (US); Adam E. Anders, Oshkosh, WI (US)

(73) Assignee: Illinois Tool Works Inc., Glenview, IL (US)

( * ) Notice: Subject to any disclaimer, the term of this patent is extended or adjusted under 35 U.S.C. 154(b) by 632 days.

(21) Appl. No.: 16/891,775

(22) Filed: Jun. 3, 2020

(65) Prior Publication Data
US 2020/0406387 A1 Dec. 31, 2020

Related U.S. Application Data

(60) Provisional application No. 62/872,956, filed on Jul. 11, 2019, provisional application No. 62/868,605, filed on Jun. 28, 2019.

(51) Int. Cl.
*B23K 9/095* (2006.01)
*B23K 9/10* (2006.01)
*B23K 9/12* (2006.01)
*G01R 19/00* (2006.01)

(52) U.S. Cl.
CPC .......... *B23K 9/0953* (2013.01); *B23K 9/1056* (2013.01); *B23K 9/124* (2013.01); *G01R 19/0084* (2013.01)

(58) Field of Classification Search
CPC .... B23K 9/095; B23K 9/0953; B23K 9/0956; B23K 9/10; B23K 9/1006; B23K 9/1043; B23K 9/1056; B23K 9/12; B23K 9/124
See application file for complete search history.

(56) References Cited

U.S. PATENT DOCUMENTS

| 6,066,832 A * | 5/2000 | Uecker .................. B23K 9/095 |
| | | 219/136 |
| 2011/0240620 A1* | 10/2011 | Ott .......................... B23K 9/124 |
| | | 219/130.5 |
| 2016/0016250 A1* | 1/2016 | Denis .................. B23K 26/147 |
| | | 219/130.1 |

FOREIGN PATENT DOCUMENTS

| JP | S5987977 A | | 5/1984 |
| KR | 20030025116 A | * | 3/2003 |
| KR | 20150031706 A | | 3/2015 |

OTHER PUBLICATIONS

European Patent Office, Communication with extended European search report, in Application No. 20181185.8, dated Dec. 2, 2020 (8 pages).

* cited by examiner

*Primary Examiner* — Nathaniel E Wiehe
*Assistant Examiner* — Theodore J Evangelista
(74) *Attorney, Agent, or Firm* — McAndrews, Held & Malloy, Ltd.

(57) ABSTRACT

Disclosed are apparatus and systems to determine voltage measurements in welding-type applications to facilitate control of welding-type processes. Disclosed systems include a remote operations interface configured to facilitate voltage measurements in welding-type applications and facilitate communication between a welding-type power supply and a wire feeder.

20 Claims, 2 Drawing Sheets

APPARATUS AND SYSTEMS TO DETERMINE VOLTAGE MEASUREMENTS IN WELDING-TYPE APPLICATIONS

CROSS REFERENCE TO RELATED APPLICATIONS

The present application claims the benefit of U.S. Provisional Patent Application Ser. No. 62/868,605 filed Jun. 28, 2019, entitled "APPARATUS AND SYSTEMS TO DETERMINE VOLTAGE MEASUREMENTS IN WELDING-TYPE APPLICATIONS" and U.S. Provisional Patent Application Ser. No. 62/872,956 filed Jul. 11, 2019, entitled "APPARATUS AND SYSTEMS TO DETERMINE VOLTAGE MEASUREMENTS IN WELDING-TYPE APPLICATIONS" The entire contents of U.S. Provisional Patent Application Ser. Nos. 62/868,605 and 62/872,956 are expressly incorporated herein by reference.

BACKGROUND

The present disclosure relates to welding systems, and more particularly to apparatus and systems to determine voltage measurements in welding-type applications.

Welding is a process that has increasingly become ubiquitous in all industries. A wide range of welding systems and welding control regimes have been implemented for various purposes. In continuous welding operations, gas metal arc welding (GMAW) and submerged arc welding (SAW) techniques allow for formation of a continuing weld bead by feeding welding wire shielded by inert gas from a welding torch. Such wire feeding systems are available for other welding systems, such as tungsten inert gas (TIG) welding. Electrical power is applied to the welding wire and a circuit is completed through the workpiece to sustain a welding arc that melts the electrode wire and the workpiece to form the desired weld. It may be desirable to determine voltage measurements in welding-type applications.

SUMMARY

The present disclosure relates generally to welding-type systems, and more particularly to apparatus and systems to determine voltage measurements in welding-type applications, substantially as illustrated by and described in connection with at least one of the figures, as set forth more completely in the claims.

DRAWINGS

The figures are not necessarily to scale. Where appropriate, similar or identical reference numbers are used to refer to similar or identical components.

DETAILED DESCRIPTION

Figure 1:
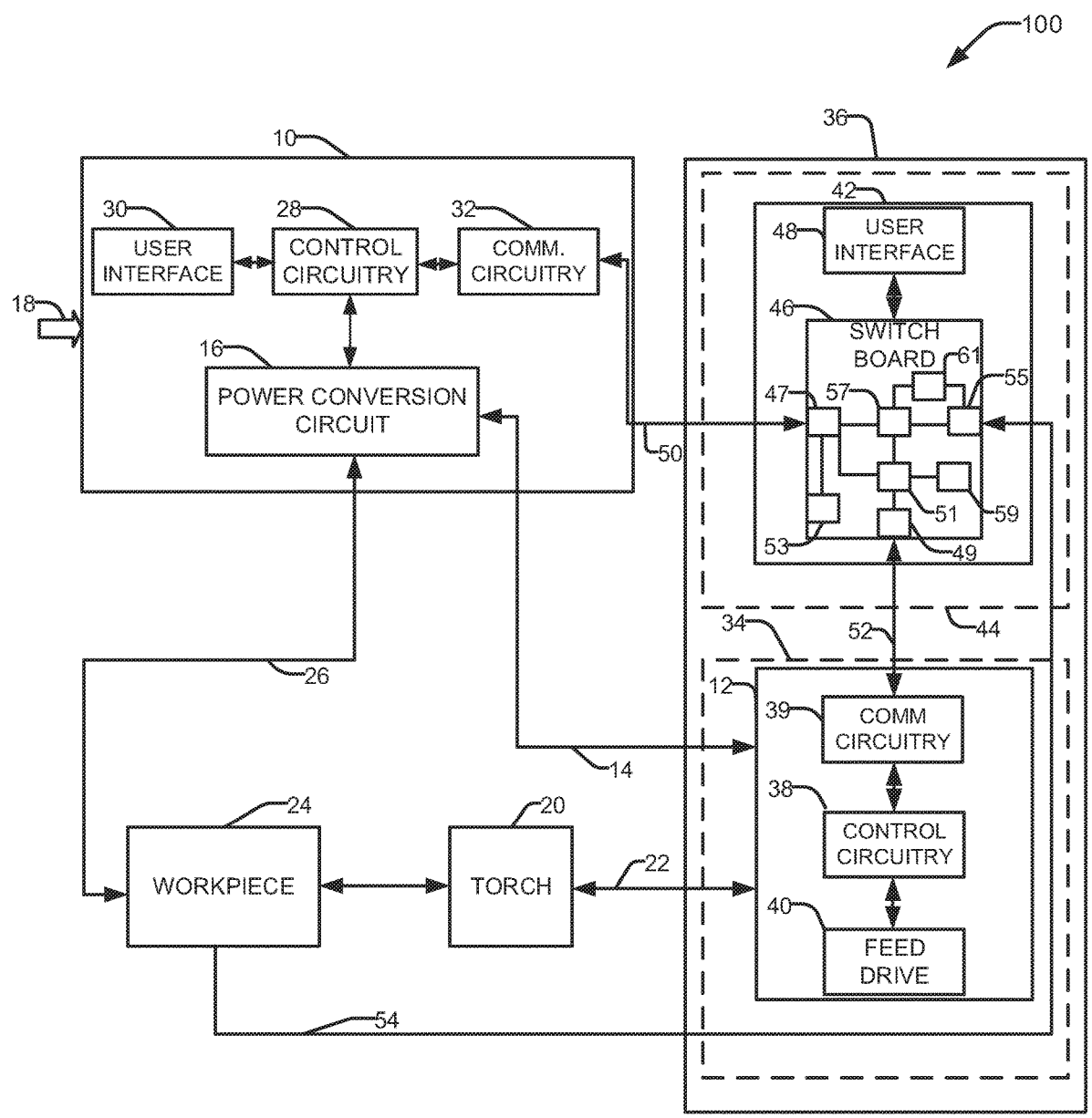
FIG. 1 is a block diagram of an example welding-type system in accordance with aspects of this disclosure.

In some welding-type applications, it is desirable to determine voltage measurements during welding-type processes. In some continuous welding operations, including GMAW (including metal inert gas ("MIG") and pulsed MIG) and SAW techniques, a power supply that provides welding-type current to melt an electrode may be located remotely from the wire feeder and the welding torch. In some examples, the wire feeder may be mounted on an articulating boom, which allows for mobility within a given area. In some robotic welding applications, the welding torch and/or the wire feeder may be mounted on a robotic arm. In situations where the wire feeder is remotely located from the power supply, and in situations where the wire feeder may be difficult for an operator to physically access (e.g., when the wire feeder is mounted on a articulating boom or in robotic welding applications), it may be desirable to include a remote operations interface located between the wire feeder and the power supply. The remote operations interface facilitates communications between the power supply and the wire feeder and is used to determine welding voltage measurements. In some examples, an operator may also view and control system parameters at the remote operations interface.

Disclosed example apparatus to determine voltage measurements in welding-type applications include: a first connector configured to connect to a power supply via a first cable; a second connector configured to connect to a wire feeder via a second cable; a third connector configured to couple to a first voltage sense lead; communications circuitry configured to communicate with the power supply and the wire feeder; and measurement circuitry configured to determine a voltage based on a first voltage signal received via the first voltage sense lead and a second voltage signal received from the wire feeder.

In some disclosed apparatus to determine voltage measurements in welding-type applications, the second voltage signal is a low voltage analog signal.

In some disclosed apparatus to determine voltage measurements in welding-type applications, the first cable and the second cable comprise Ethernet cables, and the communications circuitry communicates with the power supply and the wire feeder via the Ethernet cables.

In some disclosed apparatus to determine voltage measurements in welding-type applications, the communications circuitry is further configured to communicate with a user interface.

In some disclosed apparatus to determine voltage measurements in welding-type applications, the communications circuitry communicates with the power supply and the wire feeder via analog signals transmitted across the first cable and the second cable.

In some disclosed apparatus to determine voltage measurements in welding-type applications, the communications circuitry is configured to: receive one of a power supply command or a wire feeder command from the user interface; and transmit the received power supply command to the power supply or the wire feeder command to the wire feeder.

In some disclosed apparatus to determine voltage measurements in welding-type applications, the communications circuitry is configured to communicate with the power supply and the wire feeder in a first format and the user interface in a second format, and the communications circuitry is configured to convert communications from the first format to the second format and from the second format to the first format.

In some disclosed apparatus to determine voltage measurements in welding-type applications, the communications circuitry is configured to transmit the determined voltage to the user interface.

In some disclosed apparatus to determine voltage measurements in welding-type applications, the determined voltage is representative of a voltage between a welding torch and a workpiece.

In some disclosed apparatus to determine voltage measurements in welding-type applications, the apparatus is configured to be mounted on one of a pedestal of an articulating boom or a stationary portion of a robotic welding arm.

Disclosed example remote interface devices configured to be mounted on a pedestal of an articulating boom include: a user interface; a first connector configured to connect to a power supply via a first cable; a second connector configured to connect to a wire feeder via a second cable; a third connector configured to couple to a first voltage sense lead; communications circuitry configured to communicate with the power supply and the wire feeder; and measurement circuitry configured to determine a voltage based on a first voltage signal received via the first voltage sense lead and a second voltage signal received from the wire feeder.

In some disclosed remote interface devices, the second voltage signal is a low voltage analog signal.

In some disclosed remote interface devices, the communications circuitry is configured to: receive one of a power supply command or a wire feeder command from the user interface; and transmit the received power supply command to the power supply or the wire feeder command to the wire feeder.

In some disclosed remote interface devices, the communications circuitry is configured to transmit the determined voltage to the power supply.

In some disclosed remote interface devices, the determined voltage is indicative of a voltage between a welding torch and a workpiece.

In some disclosed remote interface devices, the communications circuitry is configured to: transmit power supply commands received via the user interface to the power supply and transmit wire feeder commands received via the user interface to the wire feeder.

Disclosed example welding-type systems include: a wire feeder; a welding-type power supply; and a remote interface device mounted on the pedestal, the remote interface device including: a user interface; a first connector configured to connect to a power supply via a first cable; a second connector configured to connect to a wire feeder via a second cable; a third connector configured to couple to a first voltage sense lead; communications circuitry configured to communicate with the power supply and the wire feeder; and measurement circuitry configured to determine a voltage based on a first voltage signal received via the first voltage sense lead and a second voltage signal received from the wire feeder.

In some disclosed welding-systems, the communication circuitry is configured to transmit the determined voltage to control circuitry of the power supply, and the control circuitry is configured to control one of an output current or an output voltage based on the determined voltage.

In some disclosed welding-systems, the wire feeder is connected to a second voltage sense lead, and the second voltage signal is based on voltage received by the wire feeder from the second voltage sense lead.

The terms "control circuit" and "control circuitry," as used herein, may include digital and/or analog circuitry, discrete and/or integrated circuitry, microprocessors, digital signal processors (DSPs), and/or other logic circuitry, and/or associated software, hardware, and/or firmware. Control circuits may include memory and a processor to execute instructions stored in memory. Control circuits or control circuitry may be located on one or more circuit boards, that form part or all of a controller, and are used to control a welding process, a device such as a power source or wire feeder, motion, automation, monitoring, air filtration, displays, and/or any other type of welding-related system.

As utilized herein, "and/or" means any one or more of the items in the list joined by "and/or". As an example, "x and/or y" means any element of the three-element set $\{(x), (y), (x, y)\}$. In other words, "x and/or y" means "one or both of x and y". As another example, "x, y, and/or z" means any element of the seven-element set $\{(x), (y), (z), (x, y), (x, z), (y, z), (x, y, z)\}$. In other words, "x, y and/or z" means "one or more of x, y and z". As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.).

The terms "welding-type power supply" and "welding-type power source," as used herein, refer to any device capable of, when power is applied thereto, supplying welding, cladding, plasma cutting, induction heating, laser (including laser welding, laser hybrid, and laser cladding), carbon arc cutting or gouging and/or resistive preheating, including but not limited to transformer-rectifiers, inverters, converters, choppers, resonant power supplies, quasi-resonant power supplies, switch-mode power supplies, etc., as well as control circuitry and other ancillary circuitry associated therewith.

As used herein, the term "wire feeder" includes the motor or mechanism that drives the wire, the mounting for the wire, and controls related thereto, and associated hardware and software.

The term "welding-type operation," as used herein, includes both actual welds (e.g., resulting in joining, such as welding or brazing) of two or more physical objects, an overlaying, texturing, and/or heat-treating of a physical object, and/or a cut of a physical object) and simulated or virtual welds (e.g., a visualization of a weld without a physical weld occurring).

As used herein, the term "welding-type power" refers to power suitable for welding, plasma cutting, induction heating, CAC-A and/or hot wire welding/preheating (including laser welding and laser cladding). As used herein, the term "welding-type power supply" refers to any device capable of, when power is applied thereto, supplying welding, plasma cutting, induction heating, CAC-A and/or hot wire welding/preheating (including laser welding and laser cladding) power, including but not limited to inverters, converters, resonant power supplies, quasi-resonant power supplies, and the like, as well as control circuit and other ancillary circuit associated therewith.

As used herein, the term "pulse welding" includes welding with output power that is generally pulsed, at a controllable frequency, between a greater peak and a lesser background, and pulse welding is performed in an arc state.

The term "power" is used throughout this specification for convenience, but also includes related measures such as energy, current, voltage, and enthalpy. For example, controlling "power" may involve controlling voltage, current, energy, and/or enthalpy, and/or controlling based on "power" may involve controlling based on voltage, current, energy, and/or enthalpy. Electric power of the kind measured in watts as the product of voltage and current (e.g., V*I power) is referred to herein as "wattage."

As used herein, the term "periodic" and/or "cyclical" welding process and/or output includes welding output that may be characterized as a series of periods and/or cycles, wherein each cycle may be the same, similar or different. As used herein, the term "energy storage device" is any device that stores energy, such as, for example, a battery, a supercapacitor, etc.

As used, herein, the term "memory" and/or "memory device" means computer hardware or circuitry to store information for use by a processor and/or other digital device. The memory and/or memory device can be any suitable type of computer memory or any other type of electronic storage medium, such as, for example, read-only memory (ROM), random access memory (RAM), cache memory, compact disc read-only memory (CDROM), electro-optical memory, magneto-optical memory, programmable read-only memory (PROM), erasable programmable read-only memory (EPROM), electrically-erasable programmable read-only memory (EEPROM), flash memory, solid state storage, a computer-readable medium, or the like.

As used herein, the term "torch" or "welding-type tool" can include a hand-held or robotic welding torch, gun, or other device used to create the welding arc.

As used herein, the term "welding mode" or "welding operation" is the type of process or output used, such as CC, CV, pulse, MIG, TIG, spray, short circuit, etc.

FIG. 1 illustrates an example arc welding system 100 (e.g., a GMAW or SAW system) for performing welding operations. As shown in the arc welding system of FIG. 1, a power supply 10 and a wire feeder 12 are coupled via a power delivery cable 14. The power supply 10 includes power conversion circuitry 16 configured to condition input power 18 (e.g., from the AC power grid, an engine/generator set, a combination thereof, or other alternative sources) to welding-type power. The power supply 10 provides welding-type current to the wire feeder 12 via the power delivery cable 14.

The wire feeder 12 is coupled to a welding torch 20 via a second cable 22. The second cable 22 provides welding-type current and welding wire from the wire feeder 12 to the torch 20. The wire feeder 12 includes circuitry (e.g., conductors, a contactor, power conversion circuitry, etc.) configured to deliver the welding-type current to the welding torch 20 that is connected to the wire feeder 12. The welding-type current arcs from the end of the torch 20 to a workpiece 24 and melts the welding wire fed from the wire feeder 12 to the torch 20, thereby forming a weld bead. The cable 22 may also provide shielding gas from a shielding gas source to the torch to shield the weld bead created by the arc. A ground cable 26 connects the workpiece 24 (e.g., via a clamp) to the power supply 10 to complete the weld circuit between the power supply 12, the wire feeder 10, the torch 20, and the workpiece 24.

It is desirable to measure welding voltages and to communicate the measured welding voltages to the power supply 10 for welding control purposes. Therefore, it is desirable to determine the voltage between the torch 20 and the workpiece 24. The power supply 10 includes control circuitry 28 which controls the welding-type power output by the power conversion circuitry 16. The power supply 10 also includes a user interface 30 at which an operator can view and control welding parameters (e.g., voltage, current, particular pulse or non-pulsed welding regimes, wire feed speed). The user interface 30 may receive inputs using any input device, such as via a keypad, keyboard, buttons, touch screen, voice activation system, wireless device, and so forth. The power supply 10 also includes communications circuitry 32, which communicates with other equipment of the welding system 100.

As illustrated in the example of FIG. 1, the wire feeder 12 is remotely located from the power supply 10. Specifically, in the example system 100 of FIG. 1, the wire feeder 12 is mounted on an articulating arm 34 of an articulating boom 36. The wire feeder 12 includes control circuitry 38 which controls the feed drive 40 (e.g., motors which drive wire feed rollers which push welding wire from a welding wire source (e.g., a wire spool) to the torch) and communication circuitry 39 which communicates with other equipment of the welding system 100. The control circuitry 38 may control the speed of the wire feed motors to control the wire feed speed. The control circuitry 38 may also receive a voltage signal from the torch 20 via the cable 22 indicative of the voltage at the torch 20 or at the wire drive 40 of the wire feeder.

A remote operations interface 42 is mounted on the pedestal 44 of the articulating boom 36. The arm 34 of the articulating boom 36 is configured to rotate around the pedestal 44 in at least one axis. For example, the arm 34 may be configured to rotate around the pedestal 44 horizontally. In some examples, the arm rotates horizontally around the pedestal and is configured to rotate vertically within an allowed angle of movement with respect to the pedestal 44. The arm 34 of the articulating boom 36 may extend several feet from the pedestal for example 5 to 20 feet. The pedestal 44 may be stationary or fixed to a support surface (e.g., the ground or floor). The articulating boom 36 thus allows for ease of mobility of the wire feeder 12 within a giving area defined by the length of the arm 34.

The remote operations interface 42 includes a switch board 46 and a user interface 48. The switch board 46 is connected to the communications circuitry 32 of the power supply 10 and the communications circuitry 39 of the wire feeder 12 via communications cables 50 and 52. The communications cables 50 and 52 may be a multi-conductor cables that supply power and communications. For example, the communications cables 50 and 52 may be 14 pin connector cables that include Ethernet cables to facilitate Ethernet communication. In some examples, the switch board 46 communicates with the communications circuitry 32 of the power supply 10 and the communications circuitry 39 of the wire feeder via digital signals transmitted over the communication cable(s) 50 and 52 (e.g., Ethernet). In some examples, the switch board 46 communicates with the communications circuitry 32 of the power supply 10 and the communications circuitry 39 of the wire feeder via analog signals transmitted over the communication cable(s) 50 and 52 (e.g., analog signals transmitted over one or more conductors of the multi-conductor cables). The switch board 46 includes a first connector 47 to connect to the first cable 50 to communicate with the power supply 10 and a second connector 49 to connect to the second cable 52 to communicate with the wire feeder 12. The switch board 46 includes communications circuitry 51 configured to communicate with the power supply 10 and the wire feeder 12 via the connectors and the communication cables 50 and 52. The switch board 46 includes power circuitry 53 configured to receive power from the power supply 10 via the cable 50 and power operation of the remote operations interface 42 from the power supply 10. In some examples, the power provided from the power supply 10 via the cable 50 is 50 volt power.

A voltage sense lead 54 is connected to the workpiece 24 and a third connector 55 of the switch board 46. The control circuitry 38 of the wire feeder receives a voltage signal from the torch 20 via the cable 22 indicative of the voltage at the torch 20. The control circuitry 38 may filter the voltage signal from the torch 20 and scale the voltage signal to a low voltage analog signal representative of the measured voltage at the torch 20. The communications circuitry 39 then transmits the low voltage analog signal to the switch board 46 via the cable 52. The switch board 46 includes measurement circuitry 57 configured to compare the received voltage signal from the voltage sense lead 54 indicative of the voltage at workpiece 24 and the voltage signal received from the wire feeder 12 via the cable 52 indicative of the voltage at the torch 20. By comparing the two signals, the measurement circuitry 57 of the switch board 46 determines the voltage between the torch 20 and the workpiece 24, which is representative of the actual welding voltage.

The switch board 46 may then transmit the determined voltage between the torch 20 and the workpiece 24 to the power supply 10 via the cable 50. The user interface 30 of the power supply 10 may display the determined voltage between the torch 20 and the workpiece 24. Based on the determined voltage, the control circuitry 28 of the power supply 10 may control the welding-type power output by the power conversion circuitry 16. For example, the control circuitry 28 may compare the determined voltage between the torch 20 and the workpiece 24 to an expected or threshold voltage, and control the power conversion circuitry 16 to increase the output power (e.g., increase one of the voltage or current) if the determined voltage is below the expected or threshold voltage. Similarly, the control circuitry 28 may control the power conversion circuitry 16 to decrease the output power if the determined voltage is above the expected or threshold voltage.

In another example, the control circuitry 28 may compare the determined voltage to a voltage range, and determine that there is an error if the determined voltage is outside of the voltage range. In some examples, the control circuitry 28 may control the power conversion circuitry 16 to disable output power if an error is detected. In some examples, the user interface 30 (or the user interface 48) may indicate that an error has occurred if an error is detected. In some examples, the communications circuitry 32 may communicate to the remote operations interface 42 that an error has occurred, and the user interface 48 may display that an error has occurred.

The control circuitry 28 may include memory to store data. The control circuitry may store determined voltage data received from the remote operations interface 42 in memory. An operator may retrieve and view stored historical determined voltage data via the user interface 30.

In some examples, the switch board 46 communicates the determined voltage between the torch 20 and the workpiece 24 to the user interface 48 of the remote operations interface 42, and the user interface 48 displays the determined voltage. The switch board 46 may communicate with the user interface 48 via serial communication (i.e., via a serial connection). Accordingly, to transfer communications between the user interface 48 and the power supply 10 and wire feeder, the switch board 46 includes conversion circuitry 59 which converts Ethernet communication to serial and serial communications to Ethernet.

In some examples, an operator may control one or more operations of the power supply 10 or the wire feeder 12 via the user interface 48. The user interface 48 may receive inputs using any input device, such as via a keypad, keyboard, buttons, touch screen, voice activation system, wireless device, and so forth. For example, an operator may input a command at the user interface 48 to adjust the output voltage from the power supply 10. The command is sent to the switch board 46 via the serial connection between the user interface 48 and the switch board 46. The switch board 46 converts the signal to Ethernet and transmits the command to the power supply control circuitry 28 via the cable 50 and the communications circuitry 32. The control circuitry 28 then commands the power conversion circuitry 16 to adjust the output power according to the operator's command. Similarly, an operator may input a command at the user interface 48 to adjust the wire feed speed. The command is sent to the switch board 46 via the serial connection between the user interface 48 and the switch board 46. The switch board 46 converts the signal to Ethernet and transmits the command to the wire feeder 12 via the cable 52 and the communications circuitry 39. The control circuitry 38 then commands the feed drive to adjust the wire feed speed according to the operator's command.

In situations where the wire feeder 12 is remotely located from the power supply 10, and in situations in which the wire feeder 12 is mounted on an arm 34 of an articulating boom 36, the remote operations interface 42 is advantageous as an operator may have easier access to the user interface 48 of the remote operations interface 42 than to similar user interfaces of the wire feeder 12 and/or the power supply 10, because the remote operations interface 42 is located in an accessible location such as the pedestal 44 of the boom 46. Further, for voltage sensing purposes, it is advantageous to connect the voltage sense lead 54 to the remote operations interface 42 rather than the power supply 10 because the remote operations interface 42 is typically physically closer to the workpiece 24 than the power supply 10, and running a voltage sense lead cable from the workpiece 24 to the power supply 10 would add an additional long cable that could cause interference in the welding environment. Further, it is advantageous to connect the voltage sense lead 54 to the remote operations interface 42 rather than the wire feeder 12, because it may be undesirable to run voltage sense lead cables along the articulating arm 34 of the articulating boom 36. The second voltage sense lead 54 is connected to the switch board 46 of the remote operations interface 42, which is mounted on the stationary pedestal 44 of the boom 36, and thus the voltage sense lead 54 does not run along the articulating arm 34.

Although described with reference to FIG. 1 as being mounted on an articulating arm 34 of an articulating boom 36, in some examples, the welding torch 20 and/or wire feeder 12 may be mounted on a robotic system configured for robotic welding. In a robotic welding system, the remote operations interface 42 may be located in an operator accessible location (e.g., a stationary portion of a robotic arm) and may facilitate communication between the wire feeder 12 and the power supply 10 in the same ways as described with reference to the system 100. Similarly, a voltage sense lead 54 may be connected to the workpiece 24 and a switchboard 46 of the remote operations interface 42 to facilitate voltage measurements, for example between the torch 20 and the workpiece 24 without undesirable long sense lead cables or sense lead cables in undesirable locations.

Although described above as the voltage between the torch 20 and the workpiece 24, the voltage sense lead 54 may be connected to any desired point in the weld circuit, and the wire feeder 12 control circuitry 38 may also receive the voltage signal at any desired point between the wire feeder 12 and the torch 20. Accordingly, the voltage between any points in the weld circuit may be determined by the remote operations interface 42 and communicated to the power supply 10.

In some examples, the switch board 46 may include detection circuitry 61 to detect whether the sense lead 54 is connected to the connector and connected to the workpiece 24. For example, the detection circuitry 61 may include a pull up resistor circuit configured to output an on signal (e.g., logic 1) if the sense lead 54 is not connected to the workpiece 24 and the connector 55, and output an off signal (e.g., logic 0) signal is the sense lead 54 is connected to the workpiece 24 and the connector 55. The output of the detection circuit 61 is transmitted to the power supply 10 via the communications circuitry 51. If the sense lead 54 is connected to the connector 55 and the workpiece 24, then the measurement circuitry 57 may be used to determine the voltage (at the torch or wire feeder), as described herein. If the sense lead 54 is not connected to the connector 55 and the workpiece 24, then the control circuitry 28 of the power supply 10 may use an alternative voltage feedback/measurement system (e.g., voltage measured at a ground cable 26 connector of the power supply 10.

Figure 2:
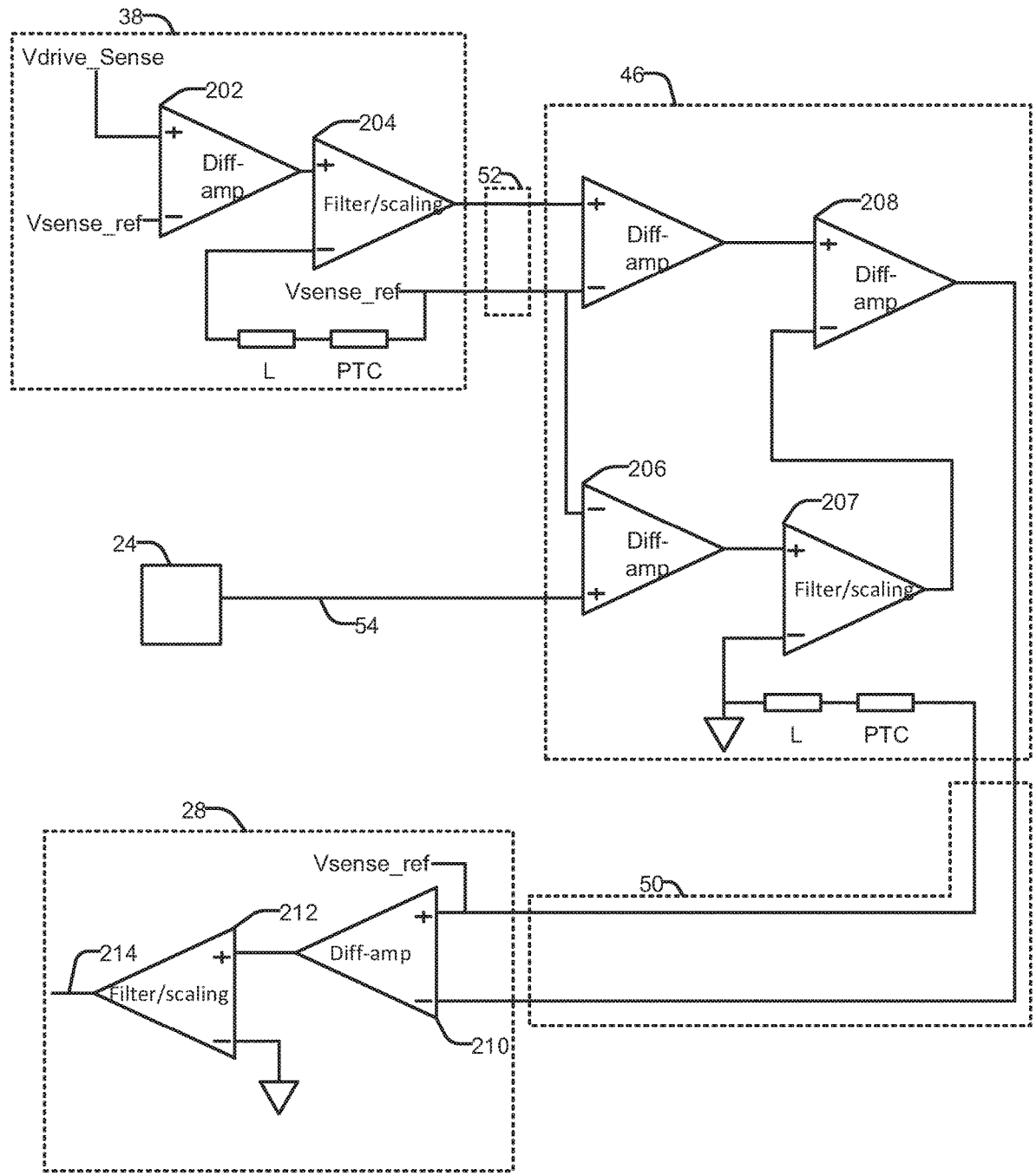
FIG. 2 is a schematic diagram of an example circuit for determining voltages in welding-type applications.

FIG. 2 illustrates a schematic diagram of an example voltage matching circuit that may be implemented on the system 100 of FIG. 1 to determine the voltage between a torch 20 and a workpiece 24 using a remote operations interface 42. As illustrated, a first differential amplifier 202, which may be implemented by the control circuitry 38 of the wire feeder 12, receives a voltage signal. The voltage signal may be received, for example, from the cable 22, which is the voltage at the torch 20. The differential amplifier 202 compares this signal to a voltage sense reference signal. The output of the first differential amplifier 202 is sent to a second amplifier 204, which downscales the measured voltage to a low voltage analog signal representative of the measured voltage. The low voltage analog signal and the voltage reference signal are transmitted across the cable 52 that connects the wire feeder 12 to the remote operations interface 42. The switch board 46 includes a differential amplifier 206 which receives the voltage signal from the workpiece 24 via the voltage sense lead 54 and compares the voltage signal from the workpiece 24 to the voltage sense reference signal. The output from the differential amplifier 206 is then sent to a scaling/filtering amplifier 207, which downscales the voltage according to the same scale as scaling amplifier 204 scaled the voltage from the torch 20.

A differential amplifier 208 compares the downscaled voltage from the differential amplifier 206 representative of the voltage at the workpiece 24 to the downscaled voltage of the torch 20 received via the cable 52 that connects the switch board 46 to the wire feeder 12. The low voltage analog signal output by the differential amplifier 208 is representative of the voltage between the torch 20 and the workpiece 24. The low voltage analog signal output by the differential amplifier 208 is transmitted to the power supply 10 via the cable 50 that connects the remote operations interface 42 to the power supply 10. A differential amplifier 210 compares the received low voltage analog signal from the cable 50 to the voltage sense reference signal. The output from the differential amplifier 210 is then filtered and scaled by an amplifier 212. The output 214 from the filter/scaling amplifier 212 is a digital signal indicative of the voltage between the torch 20 and the workpiece 24, which can be used by the control circuitry 28 of the power supply 10 to control welding operations, as described above with reference to FIG. 1. The determined voltage may also be displayed at the user interface 30 and/or transmitted back to the remote operations interface 42 and displayed at the user interface 48.

The present methods and systems may be realized in hardware, software, and/or a combination of hardware and software. Example implementations include an application specific integrated circuit and/or a programmable control circuit.

While the present method and/or system has been described with reference to certain implementations, it will be understood by those skilled in the art that various changes may be made and equivalents may be substituted without departing from the scope of the present method and/or system. For example, block and/or components of disclosed examples may be combined, divided, re-arranged, and/or otherwise modified. In addition, many modifications may be made to adapt a particular situation or material to the teachings of the present disclosure without departing from its scope. Therefore, the present method and/or system are not limited to the particular implementations disclosed. Instead, the present method and/or system will include all implementations falling within the scope of the appended claims, both literally and under the doctrine of equivalents.

The invention claimed is:

1. An apparatus to determine voltage measurements in welding-type applications, the apparatus comprising:
   a first connector configured to connect to a power supply via a first cable;
   a second connector configured to connect to a wire feeder via a second cable;
   a third connector configured to couple to a first voltage sense lead;
   communications circuitry configured to communicate with the power supply and the wire feeder; and
   measurement circuitry configured to determine a voltage based on a first voltage signal received via the first voltage sense lead and a second voltage signal received from the wire feeder, the measurement circuitry comprising a matching circuit configured to scale the first voltage signal for measurement, the matching circuit comprising:
   a first differential amplifier configured to compare the first voltage signal to a voltage reference signal;
   a filter/scaling amplifier configured to scale an output of the first differential amplifier based on the voltage reference signal;
   a second differential amplifier configured to compare the second voltage signal to the voltage reference signal; and
   a third differential amplifier configured to compare an output of the filter/scaling amplifier to an output of the second differential amplifier, and to output a measurement signal representative of the voltage between a welding-type torch and a workpiece during a welding-type operation performed using the power supply and the wire feeder.

2. The apparatus of claim 1, wherein the second voltage signal is a low voltage analog signal.

3. The apparatus of claim 1, wherein the first cable and the second cable comprise Ethernet cables, and wherein the communications circuitry communicates with the power supply and the wire feeder via the Ethernet cables.

4. The apparatus of claim 1, wherein the communications circuitry is further configured to communicate with a user interface.

5. The apparatus of claim 4, wherein the communications circuitry communicates with the power supply and the wire feeder via analog signals transmitted across the first cable and the second cable.

6. The apparatus of claim 4, wherein the communications circuitry is configured to:
receive one of a power supply command or a wire feeder command from the user interface; and
transmit the received power supply command to the power supply or the wire feeder command to the wire feeder.

7. The apparatus of claim 4, wherein the communications circuitry is configured to communicate with the power supply and the wire feeder in a first format and the user interface in a second format, and wherein the communications circuitry is configured to convert communications from the first format to the second format and from the second format to the first format.

8. The apparatus of claim 4, wherein the communications circuitry is configured to transmit the determined voltage to the user interface.

9. The apparatus of claim 1, wherein the communications circuitry is configured to transmit the determined voltage to the power supply.

10. The apparatus of claim 1, wherein the determined voltage is representative of a voltage between a welding torch and a workpiece.

11. The apparatus of claim 1, wherein the apparatus is configured to be mounted on one of a pedestal of an articulating boom or a stationary portion of a robotic welding arm.

12. A remote interface device configured to be mounted on a pedestal of an articulating boom, the remote interface device comprising:
a user interface;
a first connector configured to connect to a power supply via a first cable;
a second connector configured to connect to a wire feeder via a second cable;
a third connector configured to couple to a first voltage sense lead;
communications circuitry configured to communicate with the power supply and the wire feeder; and
measurement circuitry configured to determine a voltage based on a first voltage signal received via the first voltage sense lead and a second voltage signal received from the wire feeder, the measurement circuitry comprising a matching circuit configured to scale the first voltage signal for measurement, the matching circuit comprising:
a first differential amplifier configured to compare the first voltage signal to a voltage reference signal;
a filter/scaling amplifier configured to scale an output of the first differential amplifier based on the voltage reference signal;
a second differential amplifier configured to compare the second voltage signal to the voltage reference signal; and
a third differential amplifier configured to compare an output of the filter/scaling amplifier to an output of the second differential amplifier, and to output a measurement signal representative of the voltage between a welding-type torch and a workpiece during a welding-type operation performed using the power supply and the wire feeder.

13. The apparatus of claim 12, wherein the second voltage signal is a low voltage analog signal.

14. The apparatus of claim 12, wherein the communications circuitry is configured to:
receive one of a power supply command or a wire feeder command from the user interface; and
transmit the received power supply command to the power supply or the wire feeder command to the wire feeder.

15. The remote interface device of claim 12, wherein the communications circuitry is configured to transmit the determined voltage to the power supply.

16. The remote interface device of claim 12, wherein the determined voltage is indicative of a voltage between a welding torch and a workpiece.

17. The remote interface device of claim 12, wherein the communications circuitry is configured to:
transmit power supply commands received via the user interface to the power supply and;
transmit wire feeder commands received via the user interface to the wire feeder.

18. A welding-type system comprising:
an articulating boom having a pedestal and an arm extending from the pedestal;
a wire feeder positioned on the arm;
a welding-type power supply; and
a remote interface device mounted on the pedestal, the remote interface device comprising:
a user interface;
a first connector configured to connect to the power supply via a first cable;
a second connector configured to connect to the wire feeder via a second cable;
a third connector configured to couple to a first voltage sense lead;
communications circuitry configured to communicate with the power supply and the wire feeder; and
measurement circuitry configured to determine a voltage based on a first voltage signal received via the first voltage sense lead and a second voltage signal received from the wire feeder, the measurement circuitry comprising a matching circuit configured to scale the first voltage signal for measurement, the matching circuit comprising:
a first differential amplifier configured to compare the first voltage signal to a voltage reference signal;
a filter/scaling amplifier configured to scale an output of the first differential amplifier based on the voltage reference signal;
a second differential amplifier configured to compare the second voltage signal to the voltage reference signal, wherein the wire feeder is configured to scale a measured voltage from a welding-type torch based on the voltage reference signal to output the second voltage signal; and
a third differential amplifier configured to compare an output of the filter/scaling amplifier to an output of the second differential amplifier, and to output a measurement signal representative of the voltage between the welding-type torch and a workpiece during a welding-type operation performed using the power supply and the wire feeder.

19. The welding-type system of claim 18, wherein the communication circuitry is configured to transmit the determined voltage to control circuitry of the power supply, and wherein the control circuitry is configured to control one of an output current or an output voltage based on the determined voltage.

20. The welding-type system of claim 19, wherein the wire feeder is connected to a second voltage sense lead, and wherein the second voltage signal is based on voltage received by the wire feeder from the second voltage sense lead.

\* \* \* \* \*